United States Patent
Babinsky et al.

(10) Patent No.: US 8,352,231 B2
(45) Date of Patent: Jan. 8, 2013

(54) SYSTEM FOR PERFORMING A CO-SIMULATION AND/OR EMULATION OF HARDWARE AND SOFTWARE

(75) Inventors: Joern Babinsky, Steinenbronn (DE); Holger Horbach, Stuttgart (DE); Steffen Knoll, Stuttgart (DE); Andreas Kohler, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 645 days.

(21) Appl. No.: 12/191,441

(22) Filed: Aug. 14, 2008

(65) Prior Publication Data

US 2009/0063120 A1    Mar. 5, 2009

(30) Foreign Application Priority Data

Aug. 30, 2007    (EP) .................................... 07115280

(51) Int. Cl.
*G06F 17/50*    (2006.01)
(52) U.S. Cl. ............................................ 703/14; 703/13
(58) Field of Classification Search ............... 703/13–14
See application file for complete search history.

(56) References Cited

U.S. PATENT DOCUMENTS

| | | | |
|---|---|---|---|
| 6,470,481 B2 * | 10/2002 | Brouhard et al. | 716/106 |
| 2002/0032559 A1 * | 3/2002 | Hellestrand et al. | 703/22 |
| 2006/0117274 A1 * | 6/2006 | Tseng et al. | 716/1 |
| 2007/0225963 A1 * | 9/2007 | Horbach et al. | 703/27 |
| 2008/0184193 A1 * | 7/2008 | Devins et al. | 717/104 |
| 2009/0031289 A1 * | 1/2009 | Michael | 717/124 |

OTHER PUBLICATIONS

Chung et al. "Enhancing Performance of HW/SW Cosimulation and Coemulaiton by Reducing Communication Overhead"., IEEE Feb. 2006., pp. 125-136.*
"Accelerating system integration by enhancing hardware, firmware, and co-simulation", K. D. Schubert et al., IBM J. Res. & Dev., vol. 48, No. 3/4, May/Jul. 2004, pp. 569-581.
Cadence Design Systems, Inc., "Accelerated Hardware/Software Co-Verification: Speeds First Silicon and First Software," Open SystemC Initiative Inc., Cadence, 2005.

* cited by examiner

*Primary Examiner* — Eunhee Kim
(74) *Attorney, Agent, or Firm* — Cantor Colburn LLP; William A. Kinnaman, Jr.

(57) ABSTRACT

The present invention relates to a system for performing a co-simulation and/or emulation of hardware and software. The system includes a hardware simulator with an integrated hardware model, a hardware and/or software environment for controlling the hardware simulator and performing a software simulation and/or a direct software application, at least one synchronization facility within the hardware model for indicating a request from the hardware and/or software environment, a receiver for setting the synchronization facility into a predetermined state, and a controller for switching the hardware simulator between a free-running state and a request-handling state.

10 Claims, 5 Drawing Sheets

SYSTEM FOR PERFORMING A CO-SIMULATION AND/OR EMULATION OF HARDWARE AND SOFTWARE

CROSS-REFERENCE TO RELATED APPLICATION

This application claims the priority benefit under 35 U.S.C. §119 of prior European (EP) application 07115280.5, filed Aug. 30, 2007, and incorporated herein by reference.

BACKGROUND OF THE INVENTION

1. Field of the Invention

The present invention relates to a system for performing a co-simulation and/or emulation of hardware and software.

2. Description of the Related Art

In a co-simulation of hardware and software a hardware simulator or a hardware emulator is provided in order to simulate or emulate, respectively, a hardware model. Further, a software simulator is provided to simulate a model of software or to perform directly said software.

In the verification environment a software simulation environment needs to communicate with a hardware simulator or emulator, e.g. a VHDL (very high-speed integrated circuit hardware description language) simulator or accelerator. An inter-process communication between the two simulation environments is required.

The software simulator sends asynchronous requests to the VHDL simulator or accelerator. Said requests need to be serviced by the hardware verification environment. However, the software simulator is several orders of magnitudes faster than the VHDL accelerator. Thus, it is important that the hardware simulator or accelerator runs as fast as possible.

The current implementations of this service rely on a polling mechanism. Said polling mechanism stops the VHDL simulator or accelerator, checks for the existence of new commands and restarts the VHDL simulator or accelerator at regular intervals again. The polling mechanism interrupts the simulation even when no requests for a test case are available. Further, there is an intensive interaction between the software and the hardware simulator. The request for the test case cannot be serviced immediately, since the new request is outstanding until the end of a current poll window.

In one known method the hardware-software interaction between the hardware simulator or accelerator on the one hand and the runtime environment on the other hand is reduced by moving the major parts of a driver code into the model by supplying a VHDL provided for simulation only. Said VHDL allows driving the complete transaction sequences with minimum software overhead.

In another known method the hardware-software interaction is minimized by making use of hardware breakpoints. Said hardware breakpoints can be set up to react with specific hardware triggers and signal their occurrence to the runtime environment.

An example of such a co-simulation environment is known from the article "Accelerating system integration by enhancing hardware, firmware, and co-simulation" by K.-D. Schubert, E. C. McCain, H. Pape, K. Rebmann, P. M. West and R. Winkelmann (*IBM J. Res. & Dev.*, Vol. 48, No. 3/4, May/July 2004).

Another known example of a co-verification for hardware and software is described in the article "Accelerated hardware/software co-verification" (Cadence Design Systems, Inc., 5692C Dec. 5, 2005).

SUMMARY OF THE INVENTION

It is an object of the present invention to provide an improved system for performing a co-simulation and/or emulation of hardware and software.

This and other objects are achieved by a method as laid out in the independent claims. Further advantageous embodiments of the present invention are described in the dependent claims and are taught in the description below.

The advantages of the invention are achieved by the introduction of one or more synchronization facilities and the installation of a hardware breakpoint in the hardware model. The synchronization facilities are inserted into the hardware model before the simulation or emulation, respectively.

Therefore, the preferred embodiment of the invention is a system for performing a co-simulation and/or emulation of hardware and software, with: a hardware simulator with an integrated hardware model; a hardware and/or software environment for controlling the hardware simulator and performing a software simulation and/or a direct software application; at least one synchronization facility within the hardware model for indicating a request from the hardware and/or software environment; a receiver for setting the synchronization facility into a predetermined state; and a controller for switching the hardware simulator between a free-running state and a request-handling state.

The use of the hardware breakpoint allows setting the hardware accelerator in an operation mode with a permanent clock signal. During this time the controller gives up the control. Further, the hardware breakpoint is set and triggered by an additional software thread.

At last, the hardware simulator leaves the operation mode with the permanent clock signal and the control is returned to the controller again.

The inventive system includes two different channels. A software request channel forwards a software request, which is the request from an inter-process communication (IPC) software interface to a hardware model. A hardware request channel forwards a hardware request, which is the request from the hardware model to the IPC software interface.

The software request channel comprises a receiver for receiving new requests from the IPC interface and a controller for controlling the hardware simulator or accelerator.

BRIEF DESCRIPTION OF THE DRAWINGS

The above as well as additional objectives, features and advantages of the present invention will be apparent in the following detailed written description.

The novel and inventive features believed characteristics of the invention are set forth in the appended claims. The invention itself, their preferred embodiments and advantages thereof will be best understood by reference to the following detailed description of preferred embodiments in conjunction with the accompanied drawings, wherein:

DETAILED DESCRIPTION OF THE INVENTION

Figure 1:
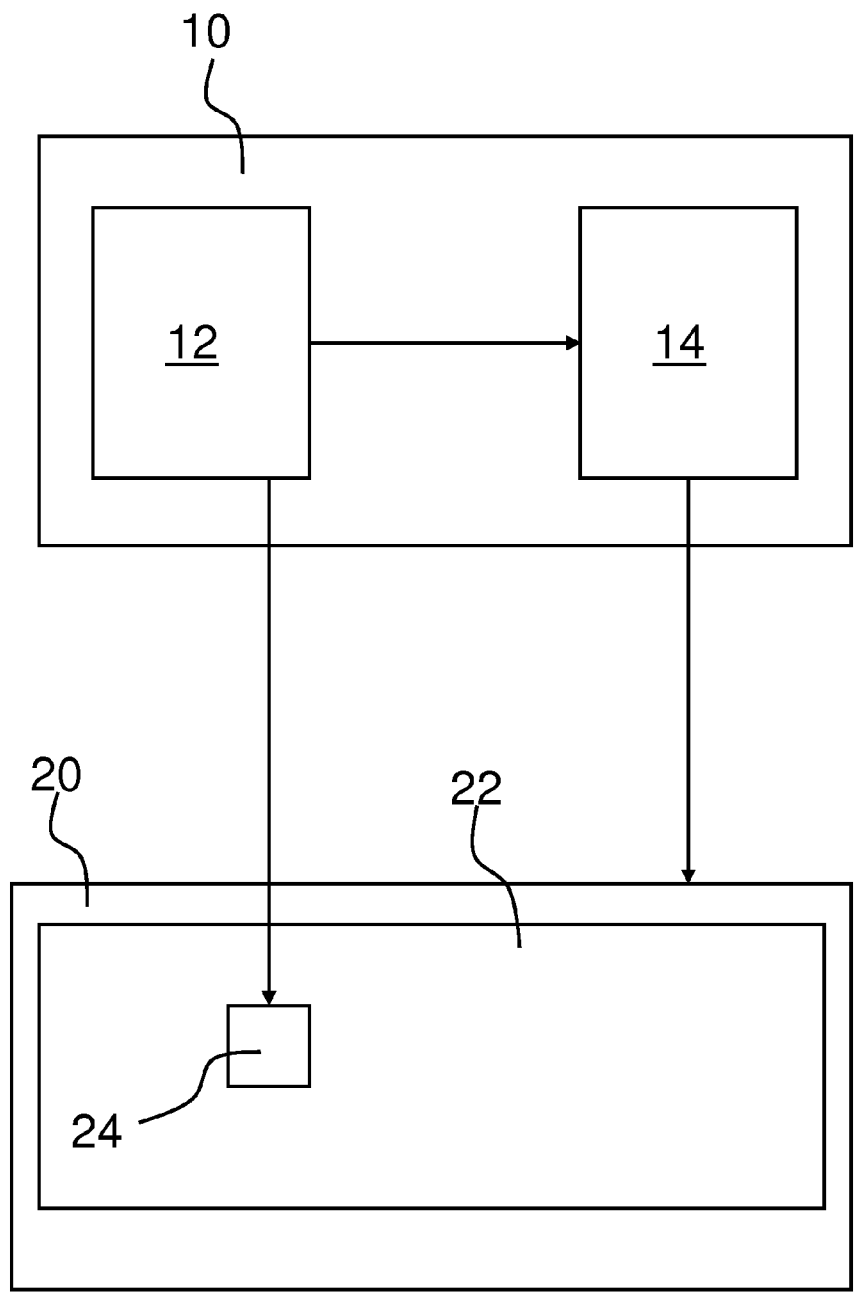
FIG. 1 illustrates a schematic diagram of a software request channel for the system according to a preferred embodiment of the present invention.

FIG. 1 illustrates a schematic diagram of a software request channel 10 according to a preferred embodiment of the present invention. The software request channel 10 is connected to a hardware accelerator 20. The hardware accelerator 20 includes a hardware model 22. The software request channel 10 is provided to forward requests from an interprocess communication (IPC) software interface to the hardware model 22.

The software request channel 10 includes a receiver 12 and a software request controller 14. The receiver 12 is connected to the software request controller 14. The receiver 12 is provided to receive the requests from the IPC software interface.

The software request controller 14 is connected to the hardware accelerator 20. The software request controller 14 is connected to the hardware accelerator 20.

The hardware accelerator 20 is a special kind of a hardware simulator. Generally an arbitrary hardware simulator can be used instead of the above hardware accelerator 20 in a similar way. The hardware model 22 comprises a synchronization facility 24. The receiver 12 is connected to the synchronization facility 24.

After the startup the software request controller 14 sets the hardware accelerator 20 into a free-running state. In this free-running state the hardware accelerator 20 is effectively blocking itself. Also the receiver 12 blocks as long as there is not any new request. During this step all software entities are blocked. The hardware accelerator 20 runs at full frequency without any software interaction in this step. In this operation mode, the software entities cannot directly interrupt the hardware accelerator 20.

When a new request is detected by the receiver 12, then the receiver 12 resumes the operation and alters the synchronization facility 24 in the hardware model 22. The synchronization facility 24 acts as a synchronization point between the software and the hardware. The synchronization facility 24 has been inserted into the hardware model 22 for this purpose. Then the receiver 12 returns into the blocking state. The change of the value in the synchronization facility 24 is detected by the hardware accelerator 20 and triggers a breakpoint. Said breakpoint forces the hardware accelerator 20 to leave the free-running mode. Further, the hardware accelerator 20 returns the control to the software request controller 14.

The software request controller 14 decodes the request. Then the software request controller 14 services the request by applying a sequence of clock signals and alter commands to the hardware accelerator 20. Once the request has been serviced, then the software request controller 14 again puts the hardware accelerator 20 into the free-running state and blocks. If any new request is received while the hardware accelerator 20 is handling requests, said new request is stored for a later handling without any interception.

Figure 2:
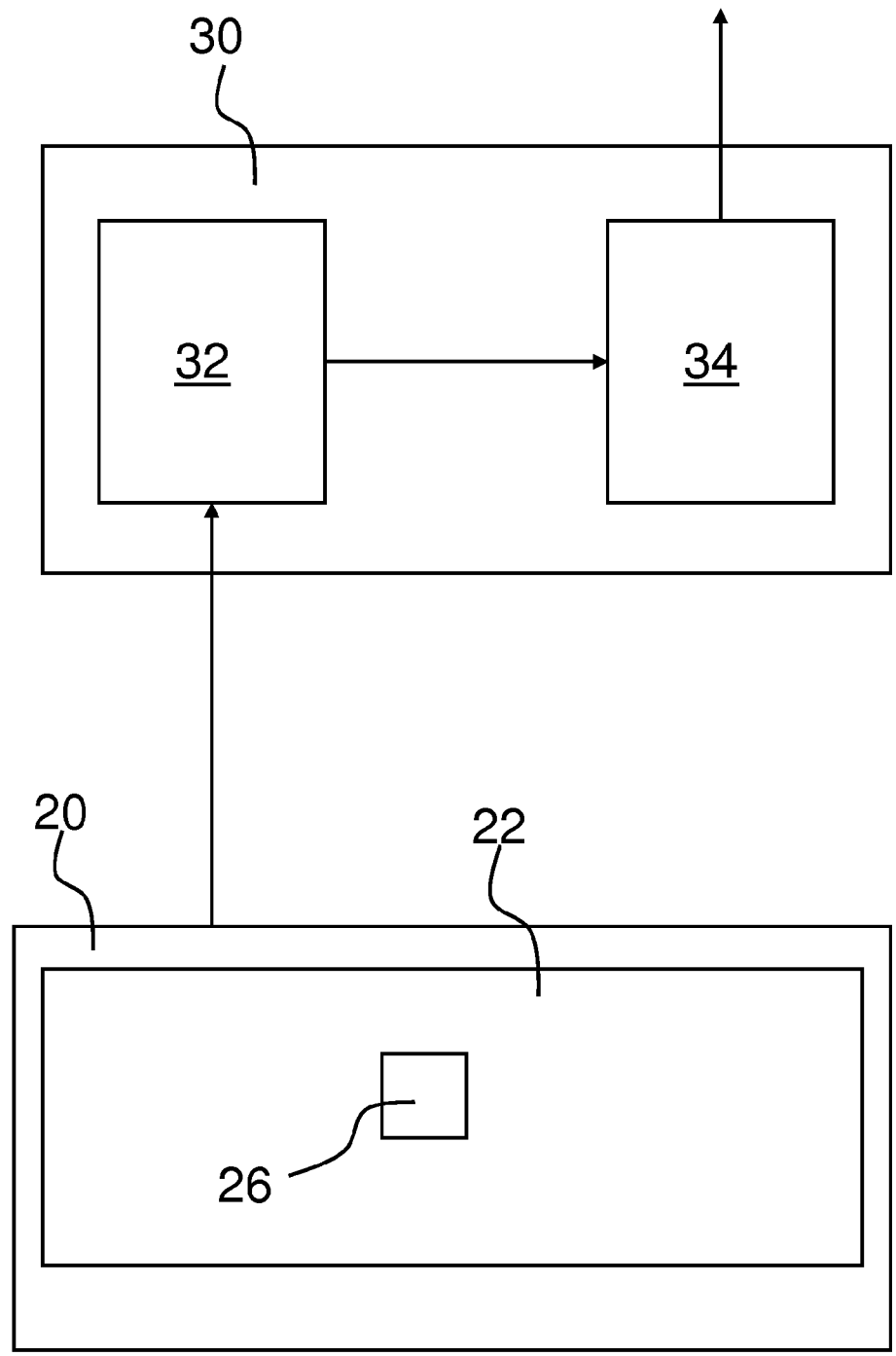
FIG. 2 illustrates a schematic diagram of a hardware request channel for a system according to the preferred embodiment of the present invention.

FIG. 2 illustrates a schematic diagram of a hardware request channel 30 according to the preferred embodiment of the present invention. The hardware request channel 30 is connected to the hardware accelerator 20. The hardware request channel 30 is provided to forward requests from the hardware model 22 to the IPC software interface.

The hardware request channel 30 includes a hardware request controller 32 and a transmission controller 34. The hardware request controller 32 is connected to the transmission controller 34.

In the hardware request channel 30 an additional breakpoint is installed. Said breakpoint is defined on an already existing notification facility 26 within the hardware model 22. This notification facility 26 indicates the availability of new requests from the hardware accelerator 30.

The hardware request controller 32 sets the hardware accelerator 20 into the free running state. The control is completely handed over to the hardware accelerator 20. If the hardware model 22 receives a new request, then the notification facility 26 will be set and the breakpoint will be triggered. The hardware request controller 32 will resume the operation in a similar way as for the software request channel 10. This time, the hardware request controller 32 reads the request from the hardware model 22.

Then, the request is forwarded to the IPC software interface by the hardware request controller 32. The request is picked up almost instantly, since the software simulator runs much faster the hardware simulation environment. Thus, no performance is lost. At last, the hardware request controller 32 returns to the free-running state again.

The hardware accelerator 20 is set into the free-running state as often as possible. Said free-running state is merely left to hand the control over the software, when a request from either the hardware model 22 or the software simulator exists. The introduction of the special hardware trigger facility and the use of the breakpoints allow the maximum throughput of requests and the maximum accelerator performance.

Figure 3:
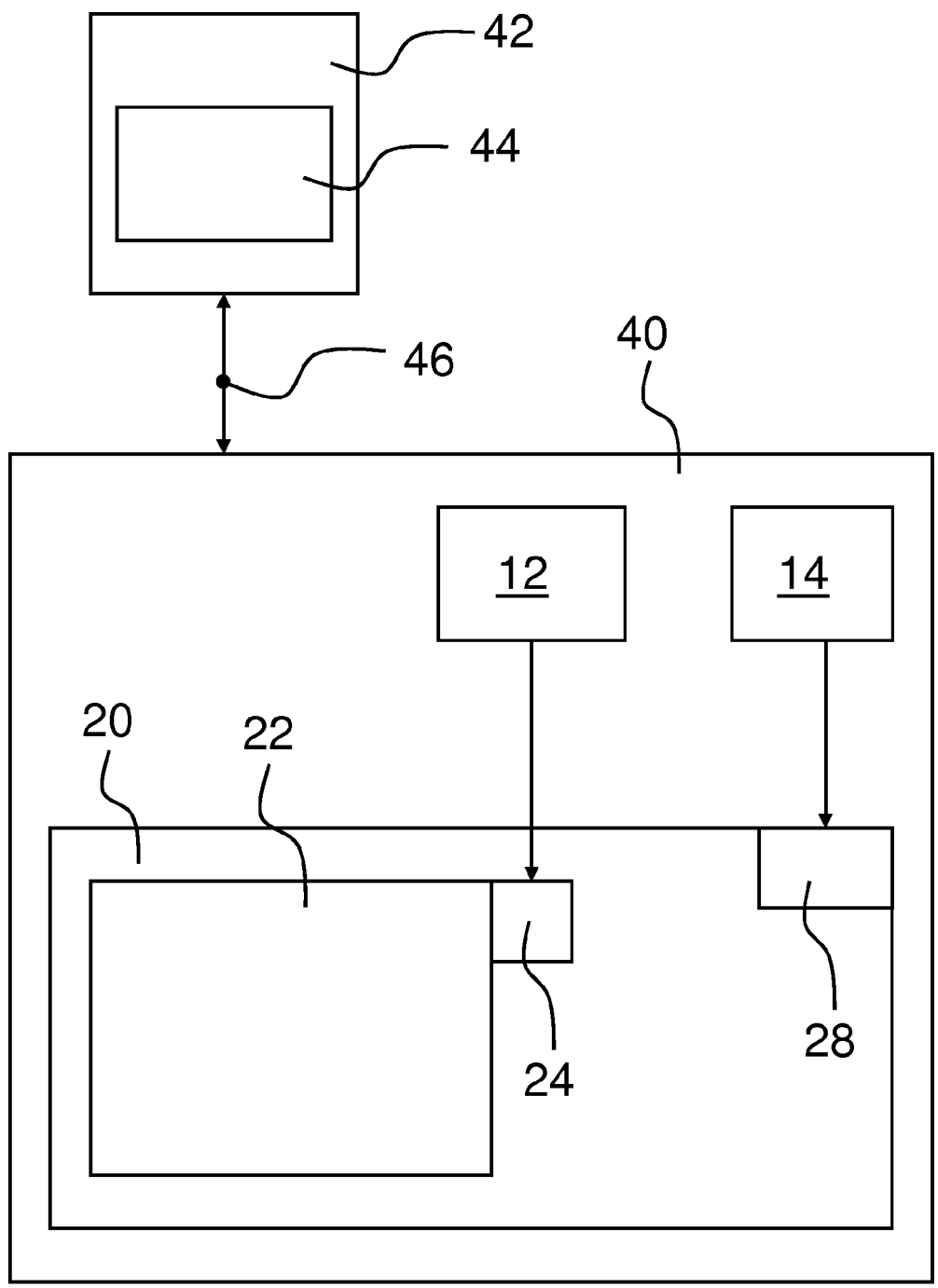
FIG. 3 illustrates a schematic diagram of the implementation of the system according to the preferred embodiment of the present invention.

FIG. 3 illustrates a schematic diagram of the implementation of the system according to the preferred embodiment of the present invention. The system comprises a hardware simulator 40 and a software simulator 42.

The hardware simulator 40 includes the hardware accelerator 20 with the hardware model 22, the synchronization facility 24 and a software interface 28. The hardware simulator 40 includes further the receiver 12 and the software request controller 14. The receiver 12 is connected to the synchronization facility 24. The receiver 12 is provided to set the synchronization facility 24. The software request controller 14 is connected to the software interface 28. The software request controller 14 sends a permanent clock signal to the software interface 28 during the handling of the request until the hardware model 22 will send a response that the test case has been done.

The software simulator 42 includes a test case command sequence 44. The software simulator 42 is connected to the hardware simulator 40 via a network socket 46. The commands are sent via the network socket 46.

The synchronization facility 24 is inserted into the hardware model 22 before the simulation or emulation, respectively. The use of the hardware breakpoint allows setting the hardware accelerator 20 in an operation mode with the permanent clock signal. During this time the software request controller 14 gives up the control. The hardware breakpoint is set and triggered by the receiver 12. The hardware accelerator 20 leaves the operation mode with the permanent clock signal and the control is returned to the software request controller 14 again.

Figure 4:
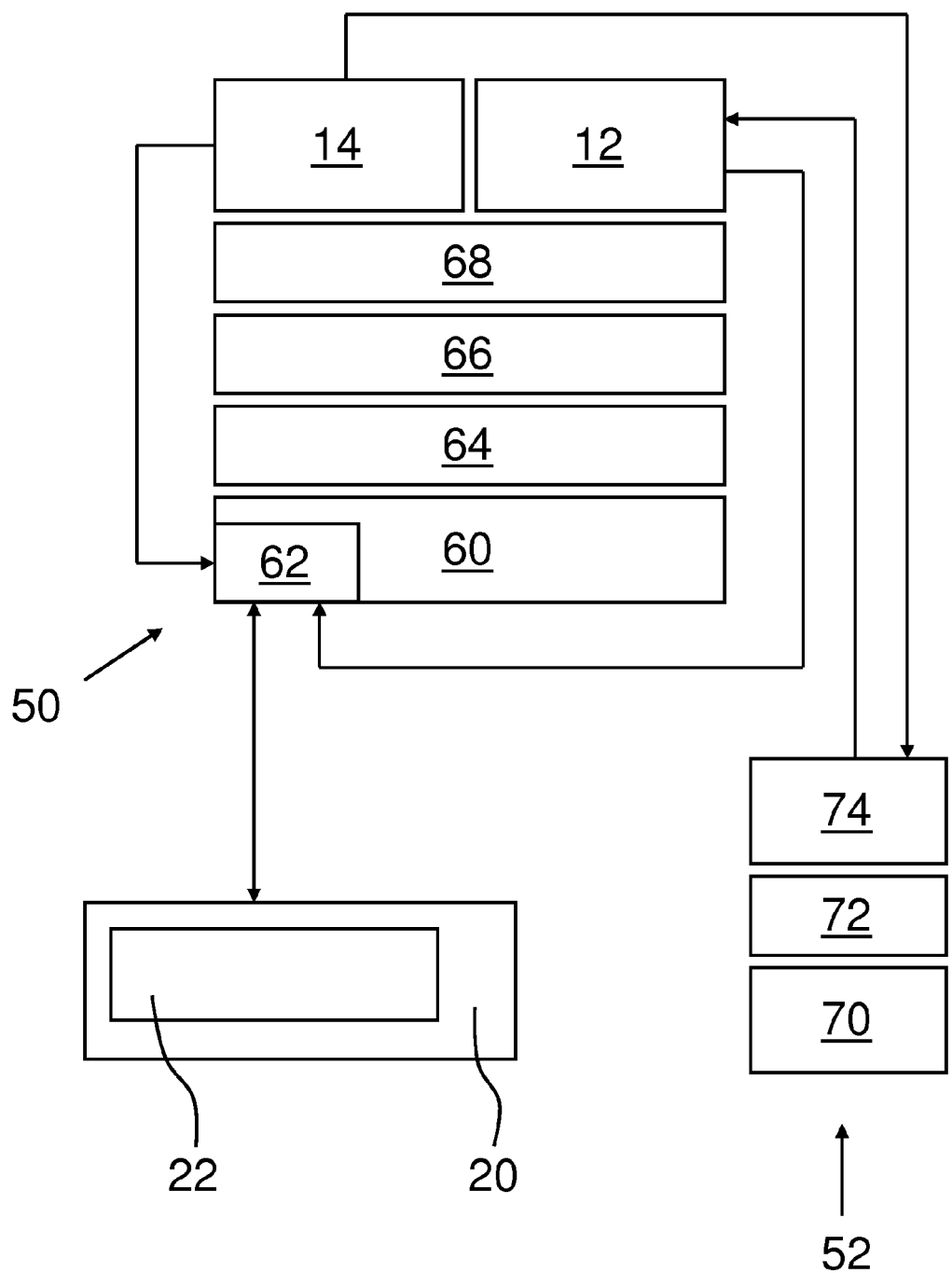
FIG. 4 illustrates a schematic diagram of a hardware and software environment for the system according to the preferred embodiment of the present invention.

FIG. 4 illustrates a schematic diagram of a hardware and software environment for the system according to the preferred embodiment of the present invention. In this example the hardware and software environment includes the hardware accelerator 20, an AIX workstation 50 and a TCP/IP (Transmission Control Program/Internet Protocol)-enabled workstation 52. On the TCP/IP-enabled workstation 52 a software simulator is running.

The hardware accelerator 20 comprises the hardware model 22. The AIX workstation 50 includes an IBM AIX operating system 60, a host adapter driver 62, an accelerator application 64, a programming interface 66, the receiver 12 and the software request controller 14. Optionally, the AIX workstation 50 includes a simulation environment 68. In this embodiment the AIX workstation 50 includes four PCI (Peripheral Component Interconnect) host adapters.

The TCP/IP-enabled workstation 52 includes an operating system 70, a software simulator application 72 and software under test 74. Said software under test 74 represents the test case. The software under test 74 is connected to the receiver 12 and to the software request controller 14. The software under test 74 sends the requests to the receiver 12 and is controlled by the software request controller 14.

The hardware accelerator 20 is a special hardware, which may be requested by the AIX workstation 50 via the PCI host adapters. The AIX workstation 50 loads the hardware model 22 from a data base and prepares it. Then the AIX workstation 50 transmits said hardware model 22 to the hardware accelerator 20. Further, the AIX workstation 50 acts as a control station for the whole simulation process. The clocking requests and the access functions are transmitted from the AIX workstation 50 to the hardware accelerator 20.

A control program runs on the AIX workstation 50 and provides a software API (Application Programming Interface). With said software API an external simulation code may control the hardware accelerator 20. The receiver 12 and the software request controller 14 are special examples for such an external simulation code.

In a simple implementation the software request controller 14 may control the hardware accelerator 20 as well as the communication with the software simulator application 72. In this case the software simulator application 72 may run on a further workstation.

The synchronization facility 24 may be realized by a piece of wire during building the model after the synthesizing the original logic circuit. Thus, the whole process is transparent to the logic designer. In a later step of the simulation a breakpoint may be installed on the synchronization facility 24.

In the beginning of the simulation the software request controller 14 installs the breakpoint on the synchronization facility 24. The breakpoint is activated as soon as the synchronization facility 24 gets the logical value "1". Since the hardware accelerator 20 initializes the synchronization facility 24 at the logical value "0", the synchronization facility 24 gets the logical value "1" only then, if the receiver 12 externally sets this value via the API of the hardware accelerator 20.

Figure 5:
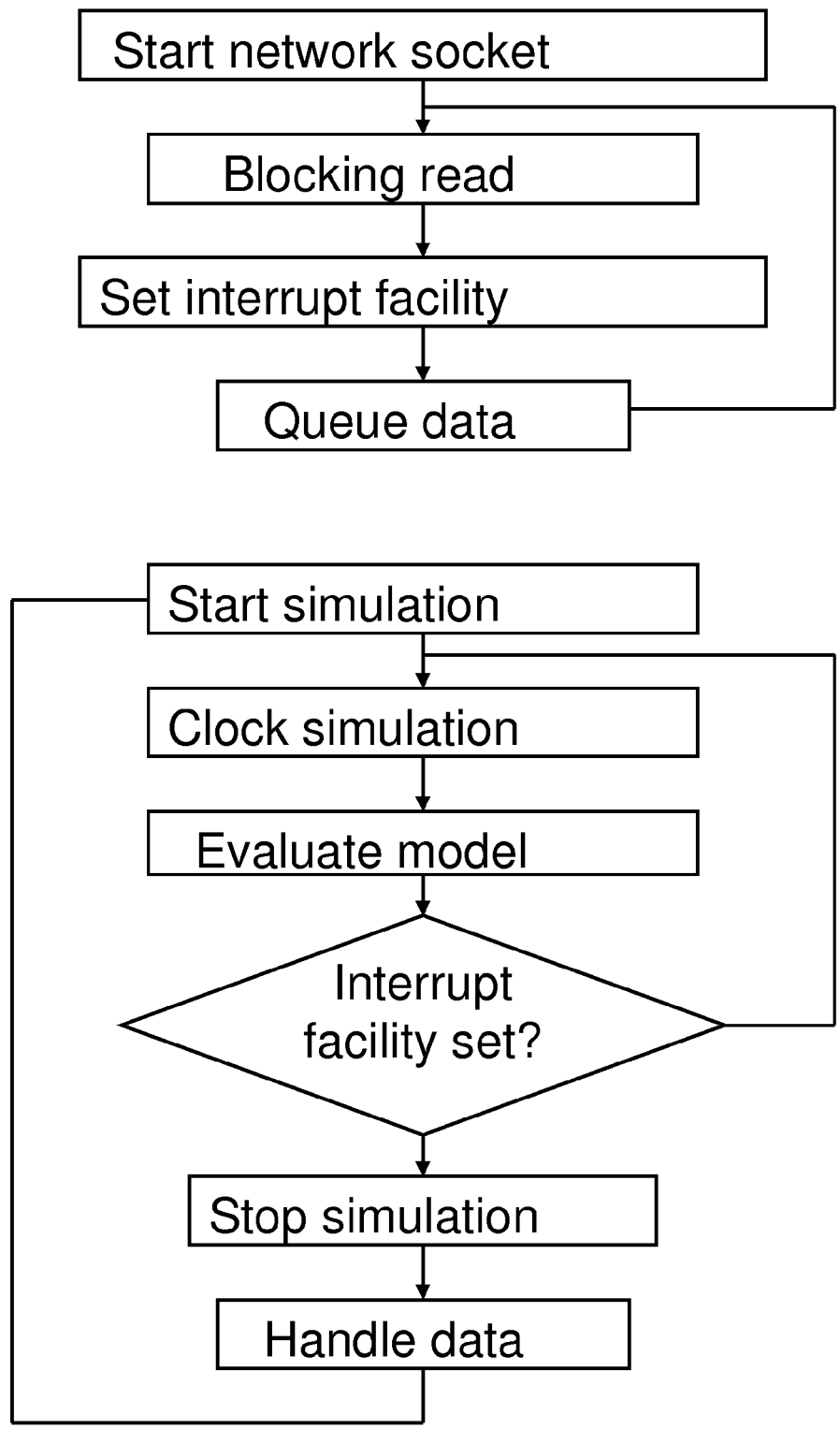
FIG. 5 illustrates a flowchart diagram of a method according to the preferred embodiment of the present invention.

FIG. 5 illustrates a flowchart diagram of the method according to the preferred embodiment of the present invention. The flowchart diagram includes a first group of four steps and a second group of six steps. The first group of steps relates to the network socket 46. The second group relates to the proper simulation process.

In the first group the network socket 46 is started in a first step. A second step blocks the reading. If the system receives any data, then in a third step the interrupt facility is set. The data are queued in the fourth step of the first group.

In the second group the simulation is started in a first step. A second step simulates the clock signal and third step evaluates the model. In a fourth step it is checked, if the interrupt facility is set. If the interrupt facility is set, then the simulation is stopped in the fifth step. The data are handled in the sixth step of the second group.

The inventive method requires no polling anymore. The number of the interrupts during the simulation process is reduced to a minimum. The full control of the simulation process is given to the hardware accelerator 20 by the permanent clock signal. This allows a maximum speed of the hardware accelerator 20.

The present invention can also be embedded in a computer program product, which comprises all the features enabling the implementation of the methods described herein. Further, when loaded in computer system, said computer program product is able to carry out these methods. More particularly, such computer program product is stored on a computer-usable medium (in particular, a tangible medium such as a magnetic or optical disk) and comprises computer-readable program means for causing a computer to implement the system of the invention.

Although illustrative embodiments of the present invention have been described herein with reference to the accompanying drawings, it is to be understood that the present invention is not limited to those precise embodiments, and that various other changes and modifications may be performed therein by one skilled in the art without departing from the scope or spirit of the invention. All such changes and modifications are intended to be included within the scope of the invention as defined by the appended claims.

LIST OF REFERENCE NUMERALS 10 software request channel
12 receiver
14 software request controller
20 hardware accelerator
22 hardware model
24 synchronization facility
26 notification facility
28 software interface
30 hardware request channel
32 hardware request controller
34 transmission controller
40 hardware simulator
42 software simulator
44 test case control sequence
46 network socket
50 AIX workstation
52 TCP/IP-enabled workstation
60 IBM AIX operating system
62 host adapter driver
64 accelerator application
66 programming interface
68 fusion simulation environment
70 operating system
72 software simulator application
74 test case, software under test

What is claimed is:

1. A system for performing a co-simulation and/or emulation of hardware and software, comprising:
   a software simulator;
   a hardware simulator with an integrated hardware model and having a free-running state and a request-handling state, wherein the software simulator is blocked from providing information or instructions to the hardware simulator when the hardware simulator is in the free-running state;
   a hardware and/or software environment for controlling the hardware simulator and performing a software simulation and/or a direct software application;
   at least one synchronization facility within the hardware model for indicating a request from the hardware and/or software environment;

a receiver for setting the synchronization facility into a predetermined state; and a controller for switching the hardware simulator between the free-running state and the request-handling state during a single simulation, the controller storing additional requests from the software environment for later processing while the hardware simulator is in the request handling state.

2. The system according to claim 1, wherein the hardware model comprises a notification facility for indicating a request from the hardware simulator.

3. The system according to claim 1, wherein the receiver is provided for receiving and/or detecting a new request from the hardware and/or software environment.

4. The system according to claim 1, wherein the synchronization facility acts as a synchronization point between the hardware simulator and the hardware and/or software environment.

5. The system according to claim 1, wherein the controller installs a breakpoint on the synchronization facility in order to switch the hardware simulator into the request-handling state.

6. The system according to claim 1, wherein a first hardware and/or software environment is provided for controlling the hardware simulator.

7. The system according to claim 6, wherein a second hardware and/or software environment is provided for performing a software simulation and/or a direct software application.

8. The system according to claim 6, wherein the first hardware and/or software environment is realized by an AIX workstation.

9. The system according to claim 1, wherein the hardware simulator is a hardware accelerator.

10. The system according to claim 1, wherein the system is realized in hardware or a combination of hardware and software.

\* \* \* \* \*